United States Patent
Bhatnagar et al.

[11] Patent Number: 6,146,926
[45] Date of Patent: *Nov. 14, 2000

[54] LATERAL GATE, VERTICAL DRIFT REGION TRANSISTOR

[75] Inventors: Mohit Bhatnagar; Charles E. Weitzel, both of Mesa, Ariz.

[73] Assignee: Motorola, Inc., Schaumburg, Ill.

[*] Notice: This patent is subject to a terminal disclaimer.

[21] Appl. No.: 09/136,492

[22] Filed: Aug. 19, 1998

Related U.S. Application Data

[60] Division of application No. 08/829,072, Mar. 31, 1997, Pat. No. 5,917,203, which is a continuation-in-part of application No. 08/681,684, Jul. 29, 1996, Pat. No. 5,780,878.

[51] Int. Cl.[7] ........................ H01L 21/332; H01L 21/336
[52] U.S. Cl. ................. 438/140; 438/173; 438/268; 438/273; 438/283
[58] Field of Search ............................. 438/173, 268, 438/931, 140, 273, 285, 589, 586

[56] References Cited

U.S. PATENT DOCUMENTS

| | | | |
|---|---|---|---|
| 5,338,945 | 8/1994 | Baliga et al. | 257/77 |
| 5,396,087 | 3/1995 | Baliga | 257/139 |
| 5,877,047 | 3/1999 | Weitzel | 438/173 |
| 5,895,939 | 4/1999 | Ueno | 257/279 |
| 5,912,497 | 6/1999 | Baliga | 257/366 |
| 5,963,807 | 10/1999 | Ueno | 438/268 |

*Primary Examiner*—Richard T. Elms
*Assistant Examiner*—Michael S. Lebentritt
*Attorney, Agent, or Firm*—Robert F. Hightower

[57] ABSTRACT

A lateral gate, vertical drift region transistor including a drain positioned on one surface of a substrate and a doped structure having a buried region therein positioned on the other surface of the substrate. The buried region defining a drift region in the doped structure extending vertically from the substrate and further defining a doped region in communication with the drift region and adjacent the surface of the doped structure. A source positioned on the doped structure in communication with the doped region and an implant region positioned in the doped region adjacent the surface and in communication with the source and buried region. An insulating layer positioned on the doped structure with a metal gate positioned on the insulating layer so as to define an inversion region in the implant region extending laterally adjacent the control terminal and communicating with the drift region and the source.

18 Claims, 5 Drawing Sheets

LATERAL GATE, VERTICAL DRIFT REGION TRANSISTOR

REFERENCE TO RELATED APPLICATIONS

This application is a divisional application of 08/829,072 now U.S. Pat. No. 5,917,203, filed on Mar. 31, 1997 which is a continuation in part of patent application number 08/681,684 now U.S. Pat. No. 5,780,878 filed on Jul. 29, 1996 with the same title and assignee.

FIELD OF THE INVENTION

The present invention pertains to transistors and the fabrication thereof, and more specifically to lateral gate, vertical drift transistors.

BACKGROUND OF THE INVENTION

Conventionally, for power device related applications (60–2000 V), silicon based power MOSFETs or IGBTs are used. In addition to high-voltage and high-current capability, these devices should also have low on-state power losses and good switching characteristics (e.g. fast switching with minimal switching losses etc.). However, at present neither of these Si devices offers an ideal combination of the aforementioned specifications. Specifically, a Si MOSFET has very good switching characteristics but for high-voltage applications, its on-resistance becomes very high. This limits usage of Si MOSFETs only for applications that require devices with a breakdown voltage ($V_B$) of less than 600–900 V. On the other hand, even for devices with high $V_B$ (600–2000 V), Si IGBTs have very good on-state characteristics (low forward voltage drop at high current-density). However, Si IGBTs can be used only for low-frequency applications (<40 KHz) because at high switching frequencies the switching losses for IGBTs become too high for practical applications. Thus, in the present day Si technology there is no single device that can offer combined benefits of Si MOSFET (fast switching, MOS gate control etc.) and Si IGBT (low forward voltage drop for high $V_B$ applications).

Recently, for power device applications silicon carbide (SiC) has gained a lot of attention due to its large electric field strength, high thermal conductivity and reasonably high mobility. It is expected that SiC based MOSFETs would be able to offer significantly improved performance advantages over their Si counterparts. For example, unlike Si technology where MOSFETs cannot be used for applications that require devices with $V_B$ greater than 900 V, SiC MOSFETs are expected to be useful for up to 2500 V applications Over the last five years, different power MOSFETs based on SiC technology have been demonstrated. Some of these devices have exhibited highly encouraging results in terms of the low on-state losses, high switching speeds, and high operating temperature capability. Two of the most commonly fabricated MOSFET structures in SiC are double-implanted MOSFET (DIMOSFET) and UMOSFET.

DIMOSFET is essentially a variation of the double diffusion MOSFET (DMOSFETs) that is one of the most commonly used power MOSFET structure in Si technology. In DIMOSFET structures diffusion processes are used to fabricate the source and the channel regions of the device. However, due to the lack of manufacturable diffusion technology for silicon carbide, DIMOSFETs cannot be fabricates in SiC. Thus, in a double-implanted MOSFET structure the source and the channel region are fabricated by using ion-implantation schemes. An alternative, vertical structure for silicon carbide is the UMOSFET disclosed in U.S. Pat. No. 5,233,215, entitled "Silicon Carbide Power MOSFET with Floating Field Ring and Floating Field Plate" and issued Aug. 3, 1993. In the UMOSFET an inversion channel is formed by an MOS gate along an etched trench.

The major problem with SiC MOSFETs based on DIMOS or UMOS technology is that due to the large breakdown field strength of SiC, in these devices the electric field in the gate oxide is very high. Experimental studies suggest that due to the high-temperature oxide reliability concerns in SiC MOS devices, the electric field in the oxide should be contained below 4 MV/cm. However, this would require limiting the electric field in SiC drift region to be much below the inherent breakdown field strength of the material. This suggests that for the case of SiC MOSFETs based on DMOS or UMOS technology, the device performance (breakdown voltage, on-resistance etc.) will be determined by the gate oxide reliability concerns and not due to the intrinsic properties of SiC.

Accordingly, it would be highly advantageous to have a manufacturable MOSFET with low ON-resistance, good switching characteristics (e.g. switching times, etc.), low leakage currents, high channel density, etc.

It is a purpose of the present invention to provide a new and improved MOSFET.

It is another purpose of the present invention to provide a new and improved MOSFET which can be fabricated in a silicon carbide material system.

It is a further purpose of the present invention to provide a new and improved silicon carbide MOSFET with lower ON-resistance, better switching characteristics, lower leakage current, and higher channel density than similar silicon devices.

It is yet another purpose of the present invention to provide a new MOSFET structure that minimizes the electric field in the gate oxide and thus, alleviates the concerns of the gate-oxide reliability at high-temperature and high electric field.

SUMMARY OF THE INVENTION

The above problems and others are at least partially solved and the above purposes and others are realized in a lateral gate, vertical drift region transistor including a semiconductor substrate having a first surface and an opposite surface with a first current terminal positioned on the opposite surface. A doped structure is formed with a buried region positioned therein. The doped structure is positioned on the first surface of the substrate and defines a surface parallel with and spaced from the first surface of the substrate. The buried region is positioned in the doped structure so as to define a drift region in the doped structure extending from and generally perpendicular to the first surface of the substrate. The buried region is further positioned in the doped structure so as to define a doped region in communication with the drift region and adjacent the surface of the doped structure. A second current terminal is positioned on the doped structure in communication with the doped region. An insulating layer is positioned on the surface of the doped structure overlying the doped region and a control terminal is positioned on the insulating layer so as to define a conduction region in the doped region. The conduction region extends laterally adjacent to the control terminal and in communication with the drift region and the second current terminal and can be either an inversion region or an accumulation region.

Generally, the substrate and doped structure are a first conductivity type and the buried region is a second conductivity type.

The buried region can be formed in several different embodiments, including implanting particles in an epitaxial layer, forming a first epitaxial layer on the substrate, forming a second epitaxial layer on the first epitaxial layer and defining the buried layer in the second epitaxial layer, and forming a third epitaxial layer on the second epitaxial layer, the third epitaxial layer defining the conduction channel.

BRIEF DESCRIPTION OF THE DRAWINGS

Referring to the drawings.

DESCRIPTION OF THE PREFERRED EMBODIMENTS

Figure 1:
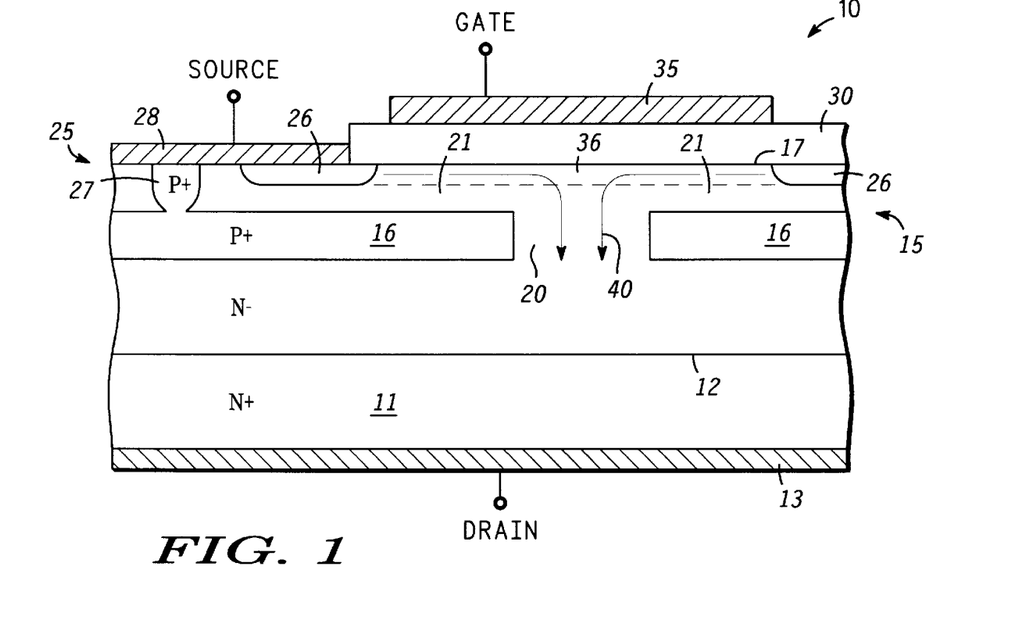
FIG. 1 is a simplified sectional view of an accumulation mode transistor in accordance with the present invention.

Referring specifically to FIG. 1, a simplified sectional view is illustrated of a lateral gate, vertical drift region transistor 10 in accordance with the present invention. Transistor 10 includes a semiconductor substrate 11 with an upper surface 12, which may be any convenient semiconductor material, such as silicon, silicon carbide, gallium arsenide, gallium nitride, etc., doped for a first type of conductivity. In this preferred embodiment, substrate 11 is formed of silicon carbide and is heavily doped ($N^+$) for n-conductivity. A layer 13 of metal is deposited on a lower or rear surface of substrate 11 and processed to form an ohmic contact by techniques well known by those skilled in the art. In this embodiment, layer 13 is a drain terminal for transistor 10. It will be understood that layer 13 can be deposited at any convenient time throughout the fabrication process and the description is included at this time for simplicity of understanding.

A doped structure 15, having a buried region 16 positioned therein, is positioned on surface 12 of substrate 11 and defines a surface 17 parallel with and spaced from surface 12 of the substrate. Buried region 16 is positioned in doped structure 15 so as to define a drift region 20 in doped structure 15 extending from and generally perpendicular to surface 12 of the substrate 11. The thickness and the doping of drift region 20 are designed to support a given breakdown voltage using basic device physics. Further, buried region 16 is positioned in doped structure 15 so as to define a doped region 21 in communication with drift region 20 and adjacent surface 17 of doped structure 15. While buried region 16 appears in FIG. 1 as two spaced apart portions, it will be understood by those skilled in the art that transistor 10 is normally constructed with a closed formation, i.e. buried region 16 may appear circular, race-track shaped, serpentine, etc in a top plan, all such formations being well known in the art.

A second current terminal 25 is positioned on doped structure 15 in communication with doped region 21. Second current terminal 25, which in this embodiment is a source terminal of transistor 10, includes an implant area 26 adjacent surface 17 which is heavily doped ($N^+$) with the first conductivity type. Second current terminal 25 is electrically coupled to buried region 16 as, for example, by means of an implant area 27 that extends between buried region 16 and surface 17 of doped structure 15 and is spaced from implant area 26. A metal layer 28 is deposited on surface 17 in electrical contact with implant area 26 and implant area 27 and is processed in a well known manner to provide an ohmic contact between metal layer 28 and implant areas 26 and 27.

An insulating layer 30 is positioned on surface 17 of doped structure 15 in overlying relationship to doped region 21. Generally, insulating layer 30 overlies surface 17 within (between) implant areas 26. In a preferred embodiment insulating layer 30 is an oxide or nitride grown on surface 17. Because doped region 21 is an n-conductivity material, the quality of the oxide grown thereon is relatively good and there are no problems with the interface or with fixed charges in the material thereunder. A metal layer 35 is deposited on layer 30 and processed in a well known manner to produce a contact which operates as a gate terminal. The MOS gate is preferable (over a Schottky gate) for controlling current in the channel region because of lower accumulation channel resistance in power devices. Also, the MOS gate offers lower gate leakage current over, for example, Schottky gates. Metal layer 35 defines an accumulation region 36 in doped region 21 adjacent surface 17. Accumulation region 36 extends laterally adjacent the gate terminal between drift region 20 and implant area 26. When properly energized by potentials applied between the source, drain and gate terminals in a well known fashion, transistor 10 conducts current from source 28, implants 26, accumulation region 36, drift region 20, and substrate 11 to drain terminal 13, as represented by arrows 40.

Figure 2:
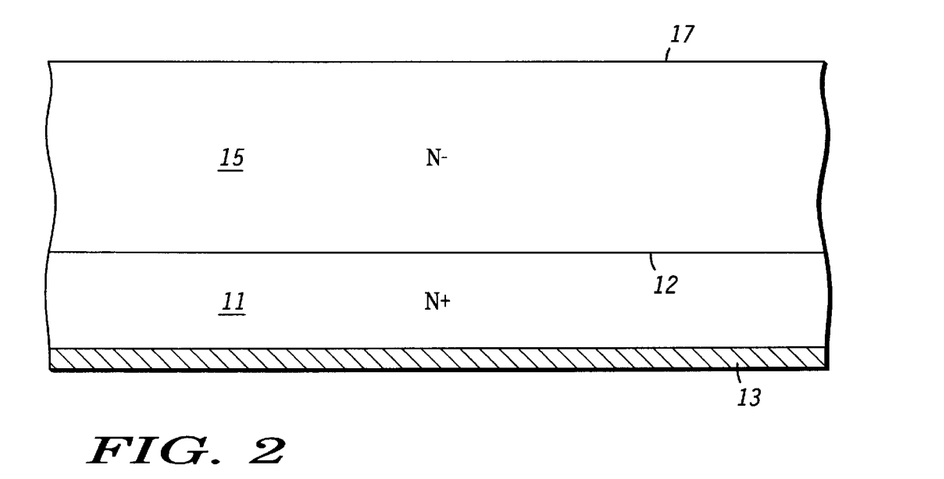
FIGS. 2–4 illustrate several steps in a method of fabricating the transistor of FIG. 1.
Figure 3:
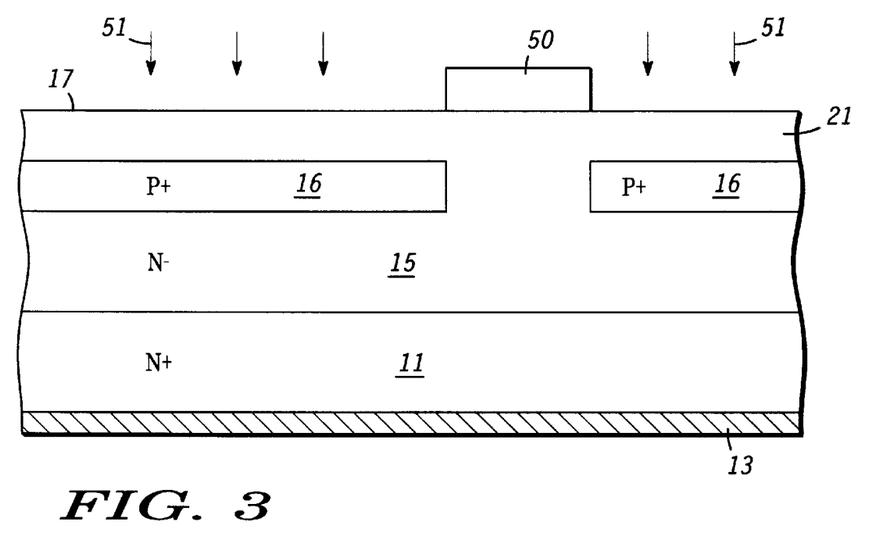
Figure 4:
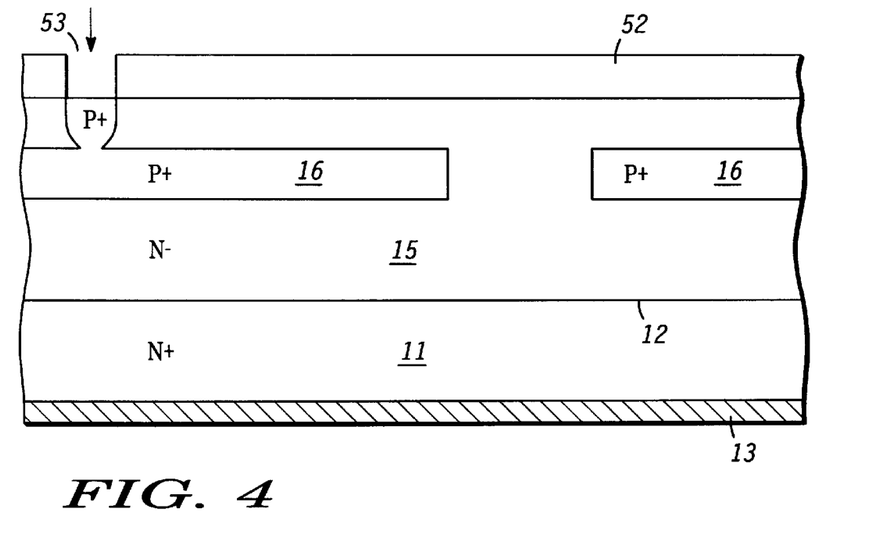

Turning now to FIGS. 2–4, several steps in one process for fabricating buried layer 16 in transistor 10 are illustrated. Components which are similar to components of transistor 10 in FIG. 1 are designated with the same numbers to aid in comparing the devices. Referring specifically to FIG. 2, a semiconductor substrate 11, in this example a silicon carbide substrate, having an upper surface 12 is provided and a current contact 13 is formed on the lower surface. Substrate 11 is heavily doped for N-conductivity. A relatively thick epitaxial layer 15 lightly doped for N-conductivity is epitaxially grown on surface 12 utilizing any of the well known processes. Epitaxial layer 15 represents doped structure 15 described in conjunction with FIG. 1 and defines an upper surface 17.

Turning to FIG. 3, an implant mask 50 is formed on surface 17 of epitaxial layer 15 in any well known manner. For example, a combination of metal layers and photoresist are deposited on surface 17 and patterned by exposing the photoresist and then using it to etch the metal. The patterned metal and remaining photoresist, if convenient, is then used as a mask to deeply implant particles into epitaxial layer 15, whereby buried layer 16 is formed. Buried layer 16 has a P-conductivity and any material which will provide this conductivity and is capable of being deeply implanted can be used.

In a specific example, the upper surface of buried layer 16 is in the range of approximately 0.2 $\mu$m to 0.3 $\mu$m below surface 17 and the lower surface is in the range of approximately 0.7 $\mu$m to 1.1 $\mu$m below surface 17. Also, the lower surface of buried layer 16 is in the range of 5 $\mu$m to 35 $\mu$m from surface 12 of substrate 11. In this example the particles forming buried layer 16 are implanted (represented by arrows 51) with a density of 5E15 to 5E16 at an energy in the range of 200 KeV to 1 MeV to achieve the desired depth. With buried layer 16 properly formed, implant mask 50 is removed.

Turning to FIG. 4, a new implant mask 52 is formed by deposition and patterning similar to that described above. In this step implant mask 52 covers the entire surface 17, except for an area 53 directly above buried layer 16. Particles are implanted through area 53 into doped region 21, defined by buried region 16, to form a heavily doped P-conductivity region 27 extending from buried region 16 to surface 17 of epitaxial layer 15. The particles are implanted from a depth in the range of approximately 0.2 $\mu$m to 0.3 $\mu$m with a density in the range of 5E15 to 5E16 and an energy in the range of 50 KeV to 300 KeV. Region 27 is provided to form an electrical connection between buried region 16 and the source terminal.

Figure 5:
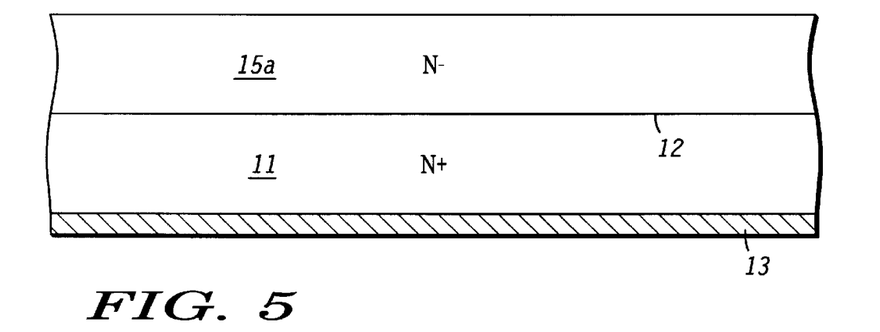
FIGS. 5–7 illustrate several steps in another method of fabricating the transistor of FIG. 1.
Figure 6:
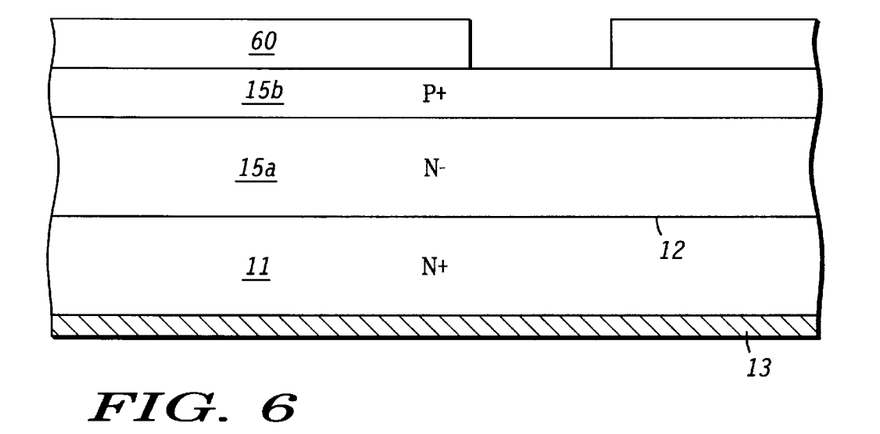
Figure 7:
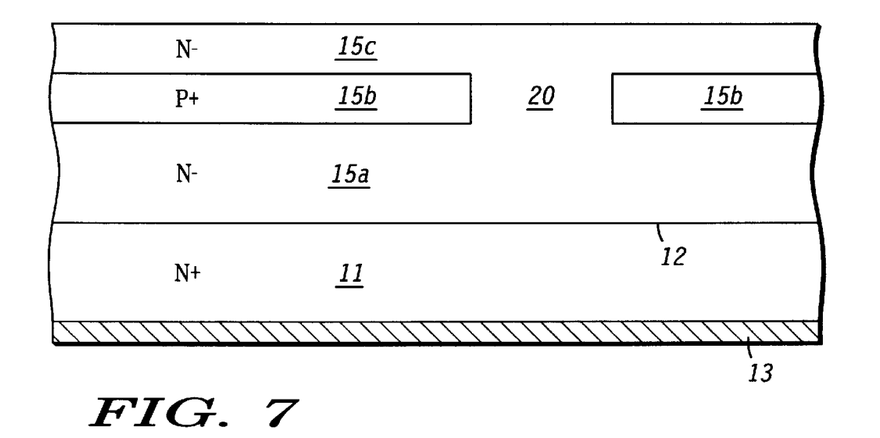

Turning now to FIGS. 5–7, several steps in another process for fabricating buried layer 16 in transistor 10 is illustrated. Components which are similar to components of transistor 10 in FIG. 1 are designated with the same numbers to aid in comparing the devices. Referring specifically to FIG. 5, a semiconductor substrate 11 having an upper surface 12 is provided and a current contact 13 is formed on the lower surface. Substrate 11 is heavily doped for N-conductivity. A first epitaxial layer 15a lightly doped for N-conductivity is epitaxially grown on surface 12 utilizing any of the well known processes. Epitaxial layer 15a represents a first portion of doped structure 15 described in conjunction with FIG. 1.

Turning to FIG. 6, a second epitaxial layer 15b heavily doped for P-conductivity is grown on first epitaxial layer 15a utilizing any of the well known processes. An etch mask 60 is formed on the upper surface of epitaxial layer 15b in any well known technique, such as photoresist or metal and patterning. Etch mask 60 is then used to etch an opening through epitaxial layer 15b, which opening will ultimately define drift region 20. A third epitaxial layer 15c is then epitaxially grown over layer 15b, including the opening therethrough. Because epitaxial layer 15b is relatively thin (0.4 $\mu$m to 0.9 $\mu$m), the nonuniformity which would be produced by the opening (drift region 20) in epitaxial layer 15b can be compensated for relatively simply, if necessary, with an additional mask and growth stage in the opening after which the mask is removed and the complete layer 15c is grown, as illustrated in FIG. 7.

Figure 8:
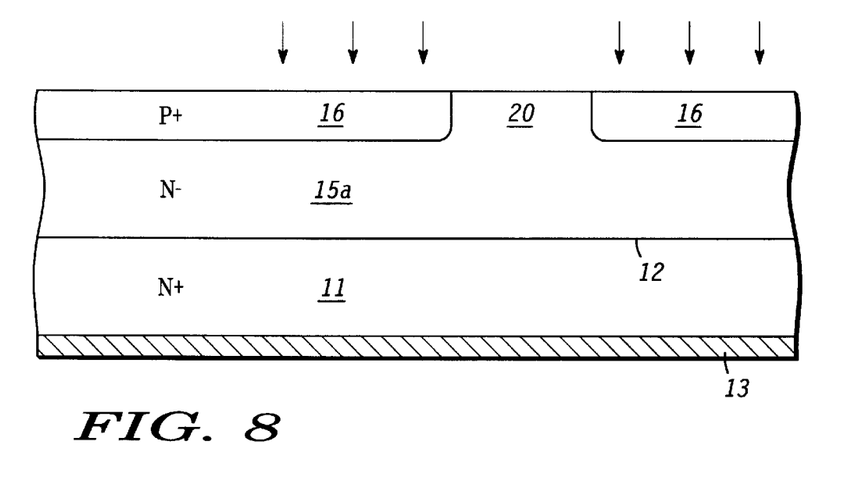
FIGS. 8–9 illustrate several steps in another method of fabricating the transistor of FIG. 1.
Figure 9:
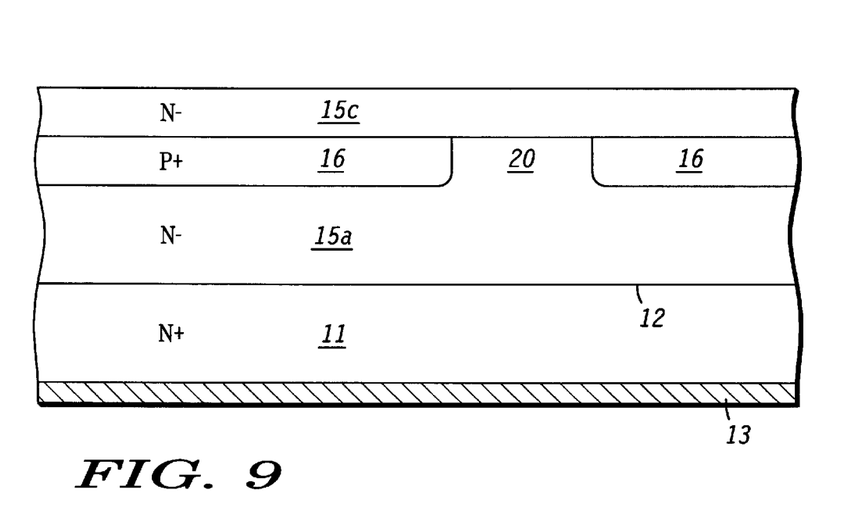

Turning now to FIGS. 8–9, several steps in yet another process for fabricating buried layer 16 in transistor 10 is illustrated. Components which are similar to components of transistor 10 in FIG. 1 (also the method of FIGS. 5–7) are designated with the same numbers to aid in comparing the devices and methods. In this embodiment it is again assumed that the structure of FIG. 5 is the starting point. After growing epitaxial layer 15a (FIG. 5), buried layer 16 is formed by ion-implantation into epitaxial layer 15a, patterning the ion implant to define drift region 20 therethrough. The ion-implantation can be performed using any of the standard techniques known in the art, generally including an implant mask (not shown). Channel layer 15c is then grown on top of implanted buried layer 16 and drift region 20, as illustrated in FIG. 9.

Figure 10:
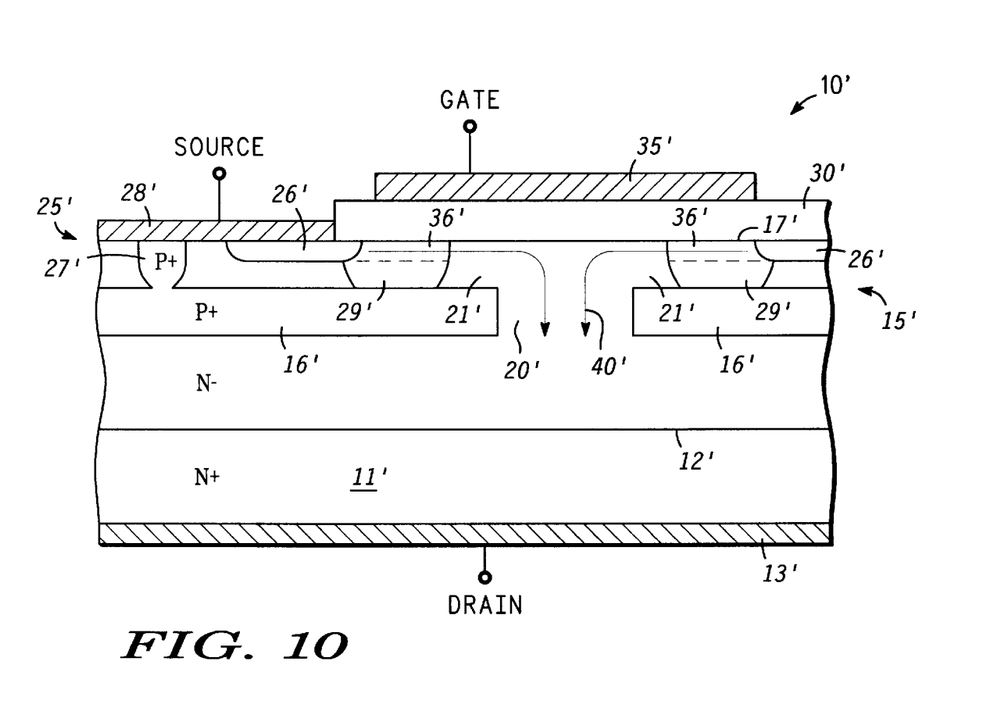
FIG. 10 is a simplified sectional view of an inversion mode transistor in accordance with the present invention.

Referring specifically to FIG. 10, a simplified sectional view is illustrated of a lateral gate, vertical drift region transistor 10' in accordance with the present invention. Components of transistor 10' in FIG. 10 which are similar to components of transistor 10 in FIG. 1 are designated with similar numbers for convenience and a prime is added to all numbers to indicate the different embodiment. Transistor 10' includes a semiconductor substrate 11' with an upper surface 12', which may be any convenient semiconductor material, such as silicon, silicon carbide, gallium arsenide, gallium nitride, etc., doped for a first type of conductivity. In this preferred embodiment, substrate 11' is formed of silicon carbide and is heavily doped (N$^+$) for n-conductivity. A layer 13' of metal is deposited on a lower or rear surface of substrate 11 and processed to form an ohmic contact by techniques well known by those skilled in the art. In this embodiment, layer 13' is a drain terminal for transistor 10'. It will be understood that layer 13' can be deposited at any convenient time throughout the fabrication process and the description is included at this time for simplicity of understanding.

A doped structure 15', having a buried region 16' positioned therein, is positioned on surface 12' of substrate 11' and defines a surface 17' parallel with and spaced from surface 12' of the substrate. Buried region 16' is positioned in doped structure 15' so as to define a drift region 20' in doped structure 15' extending from and generally perpendicular to surface 12' of the substrate 11'. The thickness and the doping of drift region 20' are designed to support a given breakdown voltage using basic device physics. Further, buried region 16' is positioned in doped structure 15' so as to define a doped region 21' in communication with drift region 20' and adjacent surface 17' of doped structure 15'. While buried region 16' appears in FIG. 10 as two spaced apart portions, it will be understood by those skilled in the art that transistor 10' is normally constructed with a closed formation, i.e. buried region 16' and other components to be explained presently may appear circular, race-track shaped, serpentine, etc in a top plan, all such formations being well known in the art.

A second current terminal 25' is positioned on doped structure 15' in communication with doped region 21'. Second current terminal 25', which in this embodiment is a source terminal of transistor 10', includes an implant area 26' adjacent surface 17' which is heavily doped (N$^+$) with the first conductivity type. Second current terminal 25' is electrically coupled to buried region 16' as, for example, by means of an implant area 27' that extends between buried region 16' and surface 17' of doped structure 15' and is spaced from implant area 26'.

In addition to, or in place of, implant area 27', material is implanted in a region 29' which is positioned in doped region 21' adjacent the surface of doped region 21' and in communication with implant area 26' of second current terminal 25'. In this preferred embodiment implant region 29' is implanted with material that produces a p+conductivity. A metal layer 28' is deposited on surface 17' in electrical contact with implant area 26' and implant area 27' and is processed in a well known manner to provide an ohmic contact between metal layer 28' and implant areas 26' and 27'.

An insulating layer 30' is positioned on surface 17' of doped structure 15' in overlying relationship to doped region 21' and implant region 29'. Generally, insulating layer 30' overlies surface 17' within (between) implant areas 26'. In a preferred embodiment insulating layer 30' is an oxide or nitride grown on surface 17'. Because doped region 21' is an n-conductivity material, the quality of the oxide grown thereon is relatively good and there are no problems with the interface or with fixed charges in the material thereunder. A metal layer 35' is deposited on layer 30' and processed in a well known manner to produce a contact which operates as a gate terminal. The MOS gate is preferable (over a Schottky gate) for controlling current in the channel region because of lower conduction channel resistance in power devices. Also, the MOS gate offers lower gate leakage current over, for example, Schottky gates. Metal layer 35' defines an inversion region 36' in implant region 29' adjacent surface 17'. Inversion region 36' extends laterally adjacent the gate terminal between drift region 20' and implant area 26'. When properly energized by potentials applied between the source, drain and gate terminals in a well known fashion, transistor 10' conducts current from source 28', implant 26', inversion region 36', drift region 20', and substrate 11' to drain terminal 13', as represented by arrows 40'.

While insulating layer 30' overlies a portion of implant region 29' (a p+conductivity), the presence of p buried layer 16' provides complete isolation of insulating layer 30' from the high electric field region, which now appears at the lower surface of buried region 16'. Thus, while insulating layer 30' may still include a poor quality of oxide at the interface with the p conductivity implant region 29', the gate oxide reliability problem under high electric field and high temperature has been substantially reduced and/or completely eliminated.

Accordingly, a new and improved MOSFET is disclosed including a vertical drift region, MOS gate control, a lateral gate or channel region, and a conduction region, which may be either an inversion or an accumulation mode. Further, the improved MOSFET can easily be fabricated in a SiC material system, in a silicon system, in a gallium arsenide system, etc. Generally, a SiC material system is preferred because of the lower ON-resistance, especially for high power applications. The vertical drift region provides higher channel density and a substantial savings in semiconductor substrate real estate. The MOS gate control provides higher transconductance and reduced gate leakage current. The lateral gate or channel region provides improved oxide and an improved epitaxial layer to oxide SiC/SiO2) interface. In the accumulation mode device, the accumulation region provides a 5 to 10 improvement factor in article mobility over prior art inversion layer devices and lower ON-resistance. In the inversion mode device, the inversion region provides an improvement in particle mobility over prior art inversion layer devices and a lower ON-resistance. Thus, a new and improved MOSFET with low ON-resistance, good switching characteristics, low leakage current, and high channel density is disclosed.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a lateral gate, vertical drift region transistor comprising the steps of:

providing a semiconductor substrate having a first surface and an opposite surface and positioning a first current terminal on the opposite surface;

forming a doped structure of a first conductivity type with a buried region positioned therein wherein the buried region is formed of a second conductivity type that is opposite of the first conductivity type and that is opposite to the conductivity type of the remainder of the doped structure and positioning the doped structure on the first surface of the substrate, forming the doped structure with a surface parallel to and spaced from the first surface of the substrate, positioning the buried region in the doped structure so as to define a drift region of the first conductivity type in the doped structure extending from and generally perpendicular to the first surface of the substrate, and further positioning the buried region in the doped structure so as to define a doped region of the first conductivity type extending laterally from the draft region between the buried region and the surface of the doped structure and in communication with the drift region and adjacent the surface of the doped structure;

positioning a second current terminal on the doped structure in communication with the doped region;

positioning an insulating layer on the surface of the doped structure overlying the doped region; and positioning a control terminal on the insulating layer so as to define an accumulation region in the doped region, extending the accumulation region laterally adjacent the control terminal and in communication with the drift region and the second current terminal.

2. A method of fabricating a lateral gate, vertical drift region transistor as claimed in claim 1 wherein the step of positioning an insulating layer includes growing an oxide.

3. A method of fabricating a lateral gate, vertical drift region transistor as claimed in claim 2 wherein the step of positioning the control terminal includes depositing a layer of metal on the oxide to form a metal-oxide-semiconductor transistor.

4. A method of fabricating a lateral gate, vertical drift region transistor as claimed in claim 1 wherein the step of providing the semiconductor substrate includes providing a substrate of silicon carbide.

5. A method of fabricating a lateral gate, vertical drift region transistor as claimed in claim 1 wherein the step of forming the doped structure with the buried region includes providing an electrical connection from the buried region to the second current terminal.

6. A method of fabricating a lateral gate, vertical drift region transistor as claimed in claim 1 wherein the step of forming the doped structure includes growing an epitaxial layer on the substrate.

7. A method of fabricating a lateral gate, vertical drift region transistor as claimed in claim 6 wherein the step of forming the doped structure with the buried region includes implanting particles in the epitaxial layer so as to define the buried region.

8. A method of fabricating a lateral gate, vertical drift region transistor as claimed in claim 7 wherein the step of implanting particles includes implanting particles so as to form an electrical connection from the buried region to the surface of the doped structure.

9. A method of fabricating a lateral gate, vertical drift region transistor as claimed in claim 1 wherein the step of forming the doped structure includes growing a first epitaxial layer with a first conductivity on the substrate, growing a second epitaxial layer with a second conductivity on the first epitaxial layer so as to define the buried region and the drift region, and growing a third epitaxial layer on the second epitaxial layer.

10. A method of fabricating a lateral gate, vertical drift region transistor as claimed in claim 1 wherein the step of forming the doped structure includes growing a first epitaxial layer with a first conductivity on the substrate, ion implanting a buried region with a second conductivity in the first epitaxial layer so as to define the drift region and growing a second epitaxial layer with the first conductivity on the buried region and the drift region.

11. A method of fabricating a lateral gate, vertical drift region transistor comprising the steps of:

providing a semiconductor substrate having a first surface and an opposite surface and positioning a first current terminal on the opposite surface;

forming a doped structure of a first conductivity type with a buried region positioned therein wherein the buried region is formed of a second conductivity type that is opposite to the first conductivity type and that is opposite to the conductivity type of the remainder of the doped structure and positioning the doped structure on the first surface of the substrate, forming the doped structure with a surface parallel to and spaced from the first surface of the substrate, positioning the buried region in the doped structure so as to define a drift region in the doped structure extending from and generally perpendicular to the first surface of the substrate, and further positioning the buried region in the doped structure so as to define a doped region in communication with the drift region and adjacent the surface of the doped structure;

positioning a second current terminal on the doped structure in communication with the doped region;

implanting material in the doped region to form an implant region adjacent the surface of the doped structure in communication with the second current terminal and the buried region;

positioning an insulating layer on the surface of the doped structure overlying the doped region and the implant region; and positioning a control terminal on the insulating layer so as to define an inversion region in the implant region, extending the inversion region laterally adjacent the control terminal and in communication with the drift region and the second current terminal.

12. A method of fabricating a lateral gate, vertical drift region transistor as claimed in claim 11 wherein the step of positioning an insulating layer includes growing an oxide.

13. A method of fabricating a lateral gate, vertical drift region transistor as claimed in claim 12 wherein the step of positioning the control terminal includes depositing a layer of metal on the oxide to form a metal-oxide-semiconductor transistor.

14. A method of fabricating a lateral gate, vertical drift region transistor as claimed in claim 11 wherein the step of providing the semiconductor substrate includes providing a substrate of silicon carbide.

15. A method of fabricating a lateral gate, vertical drift region transistor as claimed in claim 11 wherein the step of forming the doped structure includes growing an epitaxial layer on the substrate.

16. A method of fabricating a lateral gate, vertical drift region transistor as claimed in claim 15 wherein the step of forming the doped structure with the buried region includes implanting particles in the epitaxial layer so as to define the buried region.

17. A method of fabricating a lateral gate, vertical drift region transistor as claimed in claim 11 wherein the step of forming the doped structure includes growing a first epitaxial layer with a first conductivity on the substrate, growing a second epitaxial layer with a second conductivity on the first epitaxial layer so as to define the buried region and the drift region, and growing a third epitaxial layer on the second epitaxial layer.

18. A method of fabricating a lateral gate, vertical drift region transistor as claimed in claim 11 wherein the step of forming the doped structure includes growing a first epitaxial layer with a first conductivity on the substrate, ion implanting a buried region with a second conductivity in the first epitaxial layer so as to define the drift region and growing a second epitaxial layer with the first conductivity on the buried region and the drift region.

* * * * *